United States Patent [19]
Gonzalez

[11] Patent Number: 5,198,386
[45] Date of Patent: Mar. 30, 1993

[54] METHOD OF MAKING STACKED CAPACITORS FOR DRAM CELL

[75] Inventor: Fernando Gonzalez, Boise, Id.

[73] Assignee: Micron Technology, Inc., Boise, Id.

[21] Appl. No.: 895,520

[22] Filed: Jun. 8, 1992

[51] Int. Cl.⁵ .......................................... H01L 21/70
[52] U.S. Cl. ........................................ 437/52; 437/47; 437/48; 437/60; 437/228; 437/233; 437/235; 437/238; 437/919
[58] Field of Search ................. 437/47, 48, 52, 60, 437/228, 233, 235, 238, 919, 968

[56] References Cited

U.S. PATENT DOCUMENTS

| | | | |
|---|---|---|---|
| 4,413,403 | 11/1983 | Arizumi | 437/968 |
| 4,742,018 | 5/1988 | Kimura et al. | 437/48 |
| 5,045,899 | 9/1991 | Arimoto | 437/52 |

FOREIGN PATENT DOCUMENTS

| | | | |
|---|---|---|---|
| 0132950 | 8/1983 | Japan | 437/968 |
| 0202052 | 8/1988 | Japan | 437/52 |

Primary Examiner—Tom Thomas
Attorney, Agent, or Firm—Wells, St. John, Roberts, Gregory & Matkin

[57] ABSTRACT

Disclosed are methods of forming memory cell capacitors without requiring use of a buried capacitor contact mask. The method includes, a) providing an array of electrically insulated word lines atop a semiconductor wafer; b) defining upwardly exposed first active regions adjacent the word lines for connection with memory cell capacitors; c) defining upwardly exposed second active regions adjacent the work lines for electrical connection with bit lines; d) depositing a layer of polysilicon atop the wafer to cover the upwardly exposed first and second active regions; e) depositing a sacrificial layer of a thermal oxidation barrier material atop the polysilicon layer, f) etching the sacrificial oxidation barrier material selectively to define a selected pattern of oxidation barrier material atop polysilicon over the first active regions for formation of capacitor storage nodes; g) subjecting the wafer to thermal oxidation conditions to oxidize unmasked areas of the polysilicon layer, h) after subjecting the wafer to the thermal oxidation conditions, etching remaining sacrificial oxidation barrier material from the wafer to upwardly expose unoxidized polysilicon, such exposed unoxidized polysilicon comprising isolated capacitor storage nodes; i) providing a layer of capacitor dielectric atop the isolated capacitor storage nodes; and j) providing a layer of cell polysilicon atop the capacitor dielectric layer.

19 Claims, 8 Drawing Sheets

METHOD OF MAKING STACKED CAPACITORS FOR DRAM CELL

TECHNICAL FIELD

This invention relates generally to the fabrication of three dimensional stacked capacitors, and to three dimensional stacked capacitor constructions.

BACKGROUND OF THE INVENTION

As DRAMs increase in memory cell density, there is a continuous challenge to maintain sufficiently high storage capacitance despite decreasing cell area. Additionally, there is a continuing goal to further decrease cell area. A principal way of increasing cell capacitance is through cell structure techniques. Such techniques include three dimensional cell capacitors, such as trenched or stacked capacitors. This invention concerns stacked capacitor cell constructions.

Figure 1:
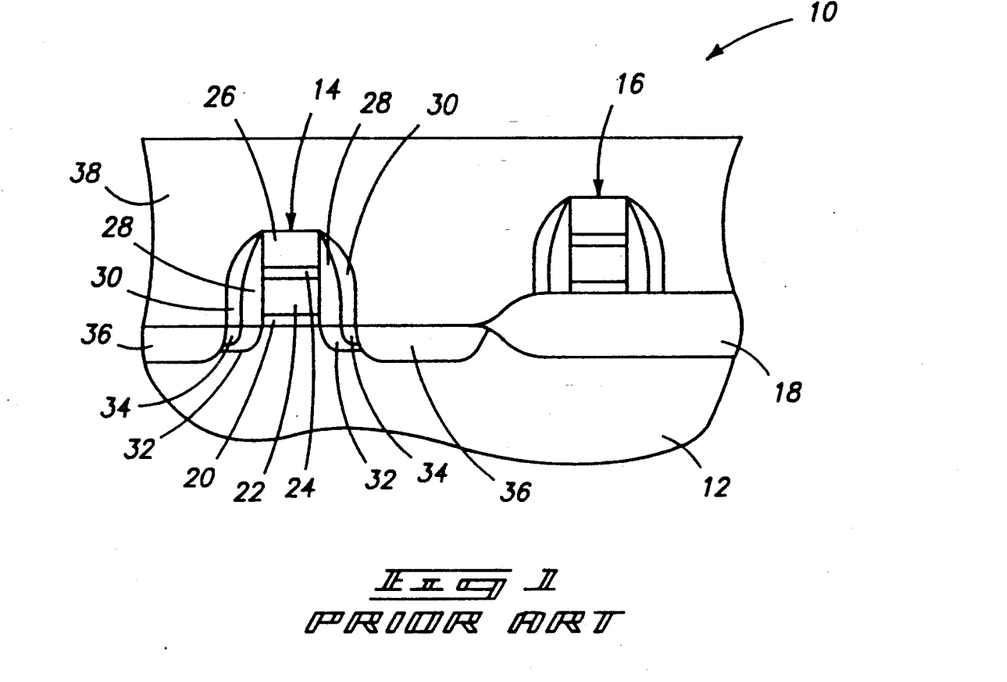
FIG. 1 is a sectional view of a prior art wafer fragment at one processing step in accordance with prior art methods, and is discussed in the "Background" section above.

With the conventional stacked capacitor, the capacitor is formed immediately above and electrically connected to the active device area of the associated MOS transistor of the memory cell. Problems associated with the prior art are described with reference to FIGS. 1-3. FIG. 1 illustrates a semiconductor wafer fragment 10 comprised of a bulk substrate 12, a pair of adjacent word lines 14, 16, and field oxide region 18. The illustrated region between word lines 14 and 16 will be utilized for formation of a stacked capacitor construction. The area to the left of word line 14 will be utilized for a bit line contact.

Substrate 12 is comprised of a p-type material having a p-type dopant concentration of approximately $2 \times 10^{15}$ atoms/cm$^3$, with the intent being to form n-channel transistors utilizing word lines 14 and 16. Such word lines are comprised of a conventional construction of gate oxide 20, conductively doped polysilicon 22, a more highly conductive silicide layer 24, and an overlying insulating oxide cap 26. Pairs 28, 30 of anisotropically etched side wall spacers are provided about outer edges of word lines 14 and 16. Such function to insulate the sides of word lines 14 and 16, and in the course of processing provide desired spacings for formation of LDD regions. The illustrated double side wall spacer is utilized to facilitate formation of the desired LDD construction for proper circuit operation.

More specifically and prior to any spacer formation, a p-type LDD halo implant at a dose of approximately $4 \times 10^{12}$ atoms/cm$^2$ is provided into bulk substrate 12 to provide halo regions 32. Such constitute a part of an LDD construction. Thereafter, a layer of insulating material, typically SiO$_2$, is deposited atop the wafer and anisotropically etched to form spacer pairs 28. Thereafter, an n-type LDD implant is conducted at a typical dose of $1.5 \times 10^{13}$ atoms/cm$^2$ to produce regions 34, as shown. Such constitute a further aspect of a LDD construction, as is known by people of skill in the art. Thereafter, another layer of insulating material, such as SiO$_2$, is deposited and anisotropically etched to produce spacer pairs 30. Thereafter, a heavy n+ implant, typically at a dose of $8 \times 10^{15}$ atoms/cm$^2$, is provided to form high concentration n+ regions 36. Such regions 36 will be utilized to connect with bit lines and for capacitor formation.

Figure 2:
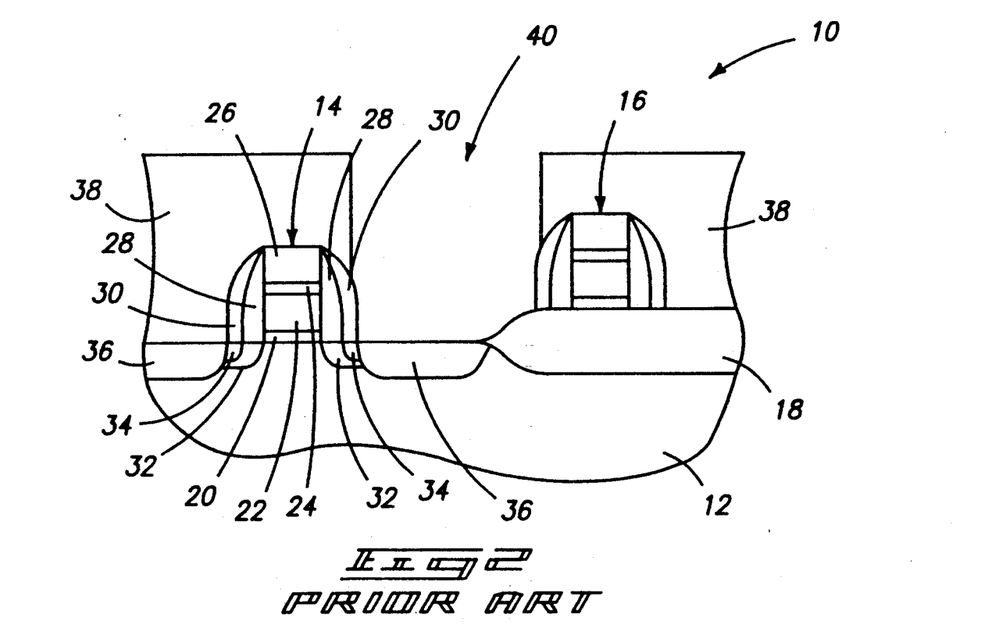
FIG. 2 is a view of the FIG. 1 wafer at a prior art processing step subsequent to that illustrated by FIG. 1.

The process typically next continues by depositing and planarizing a layer 38 of insulating material. Referring to FIG. 2, insulating layer 38 is typically patterned and etched to produce a contact opening 40 which extends downwardly to active region 36 between word lines 14 and 16 for ultimate formation of a capacitor construction. It would of course be desirable, with a principle goal of circuit density maximization, to space the illustrated word line 14 as close as possible to the field oxide region, and correspondingly allow all the word lines and accompanying circuitry to be crowded closer together. However, added space must be provided to allow for inevitable mask misalignment which might otherwise lead to destruction of the circuit. Presently, this added space for misalignment requires an extra 0.15 micron beyond that which would otherwise be required if photolithographic techniques could be avoided in providing contacts to active area 36.

Figure 3:
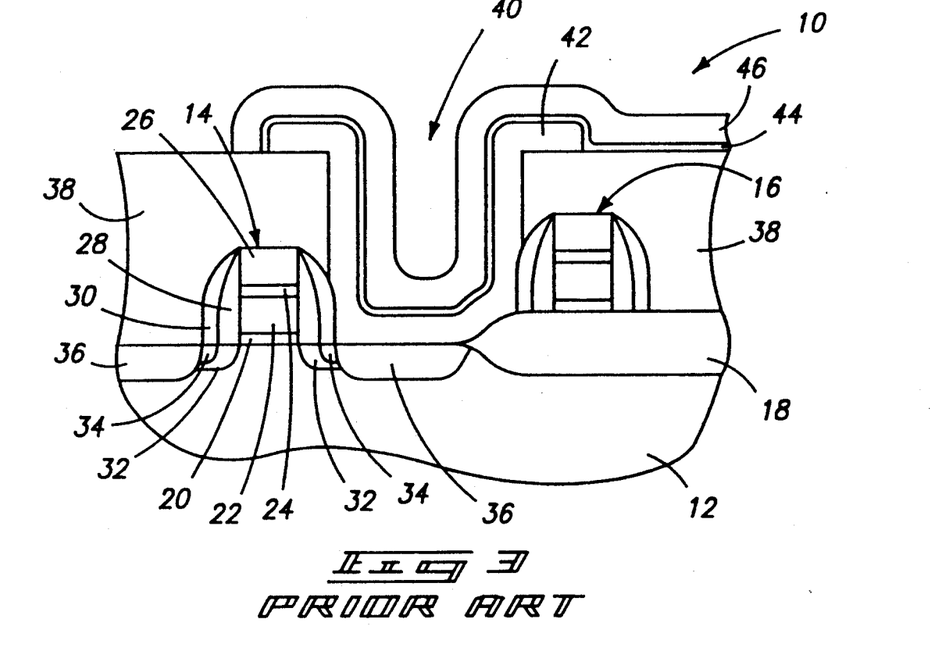
FIG. 3 is a view of the FIG. 1 wafer at a prior art processing step subsequent to that illustrated by FIG. 2.

Referring to FIG. 3, a layer 42 of polysilicon is deposited and patterned as illustrated to define isolated capacitor storage nodes. Polysilicon layer 42 is doped with an electrically conductive enhancing impurity to render such region electrically conductive. Thereafter, a thin capacitor dielectric layer 44, followed by a thicker capacitor cell polysilicon layer 46, is deposited to complete construction of the capacitor.

It would be desirable to improve upon these and other aspects of three dimensional stacked capacitor constructions, and to provide techniques which do not require use of insulating layer 38 and its associated buried contact mask.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming memory cell capacitors without using a buried capacitor contact mask comprises the following steps:

providing an array of electrically insulated word lines atop a semiconductor wafer;

defining upwardly exposed first active regions adjacent the word lines for connection with memory cell capacitors;

defining upwardly exposed second active regions adjacent the word lines for electrical connection with bit lines;

depositing a layer of polysilicon atop the wafer to cover the upwardly exposed first and second active regions;

depositing a sacrificial layer of a thermal oxidation barrier material atop the polysilicon layer, the oxidation barrier material being selectively etchable relative to the underlying polysilicon;

etching the sacrificial oxidation barrier material selectively relative to the underlying polysilicon to define a selected pattern of masking oxidation barrier material atop polysilicon over the first active regions for formation of capacitor storage nodes;

subjecting the wafer to thermal oxidation conditions to oxidize unmasked areas of the polysilicon layer, the patterned sacrificial masking oxidation barrier material precluding appreciable oxidation of polysilicon thereunder during such oxidation;

after subjecting the wafer to the thermal oxidation conditions, etching remaining sacrificial oxidation barrier material from the wafer to upwardly expose unoxidized polysilicon, such exposed unoxidized polysilicon comprising isolated capacitor storage nodes;

providing a layer of capacitor dielectric atop the isolated capacitor storage nodes; and providing a layer of cell polysilicon atop the capacitor dielectric layer.

In accordance with another aspect of the invention, a method of forming memory cell capacitors without using a buried capacitor contact mask comprises the following steps:

providing an array of electrically insulated word lines atop a semiconductor wafer;

defining upwardly exposed first active regions adjacent the word lines for connection with memory cell capacitors;

defining upwardly exposed second active regions adjacent the word lines for electrical connection with bit lines;

depositing a sacrificial layer of a thermal oxidation barrier material atop the wafer to cover the upwardly exposed first and second active regions;

etching sacrificial masking oxidation barrier material selectively relative to underlying material to define a covering pattern of masking oxidation barrier material over the first active regions and to upwardly expose second active regions;

subjecting the wafer to thermal oxidation conditions to oxidize unmasked second active areas, the patterned sacrificial masking oxidation barrier material layer precluding appreciable oxidation of first active regions thereunder during such oxidation;

after subjecting the wafer to the thermal oxidation conditions, selectively etching remaining sacrificial oxidation material from the wafer to upwardly expose first active regions;

providing a layer of capacitor storage node polysilicon atop the wafer;

providing a layer of capacitor dielectric atop the capacitor storage node layer; and providing a layer of cell polysilicon atop the capacitor dielectric layer.

Figure 4:
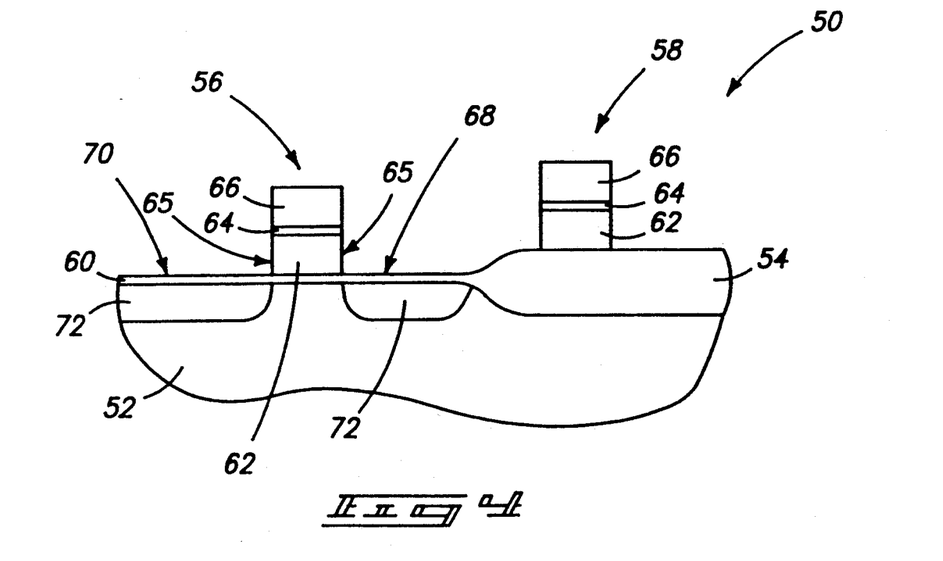
FIG. 4 is a diagrammatic sectional view of a semiconductor wafer fragment at one processing step in accordance with the invention.

More particularly and first with reference to FIGS. 4–11, a semiconductor wafer fragment 50 comprised of a bulk substrate region 52, field oxidation region 54 and a pair of word lines 56, 58 is illustrated in FIG. 4. Word lines 56 and 58 are comprised of a gate oxide region 60, conductively doped polysilicon region 62, a metal silicide layer 64 and an overlying oxide cap 66. Layers 66, 64 and 62 have been patterned as shown to define word line outlines 56, 58. Word line 56, 58 include opposing edges 65 of polysilicon material. Word lines 56 and 58 are patterned to define first region 68 for formation of first n-channel active areas for electrical connection with a memory cell capacitor, and to define second region 70 for formation of second n-channel active areas for electrical connection with bit lines.

A punch-through, p-type LDD halo implant is conducted through gate oxide layer 60 into first and second regions 68, 70, respectively, to define implant region 72 for use in formation of LDD regions for the first and second n-channel active areas. An example dopant would be boron implanted at an energy of 50 KeV at a dose of $4 \times 10^{12}$ atoms/cm$_2$.

Figure 5:
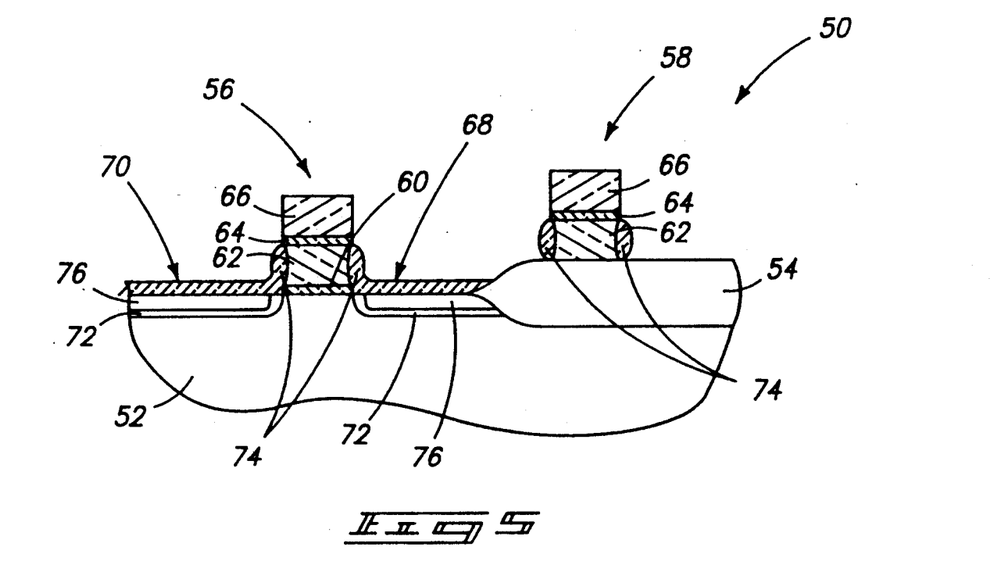
FIG. 5 is a view of the FIG. 4 wafer at a processing step subsequent to that shown by FIG. 4.

Referring to FIG. 5, wafer 50 is subjected to oxidizing conditions to oxidize outer opposing edges 65 of word line polysilicon to grow laterally projecting first word line oxide spacers 74. Such spacers preferably have a thickness of from about 500 Angstroms to about 1000 Angstroms, with about 750 Angstroms being most preferred. Example conditions for producing such 750 Angstrom thick spacers 74 would include using an oxidizing ambient H$_2$/O$_2$ gas at 900° C. for about 15 minutes. Such conditions also cause oxide to form or grow off the upper surface of the silicon of regions 68 and 70, causing oxide layer 60 to grow slightly in these areas, as shown. After such first spacer formation, an n— LDD implant is conducted into first and second regions 68, 70, respectively, to define implant region 76. An example deposition would be to provide a phosphorus dopant at 100 KeV at a dose of $1.5 \times 10^{13}$ atoms/cm$^2$.

Figure 6:
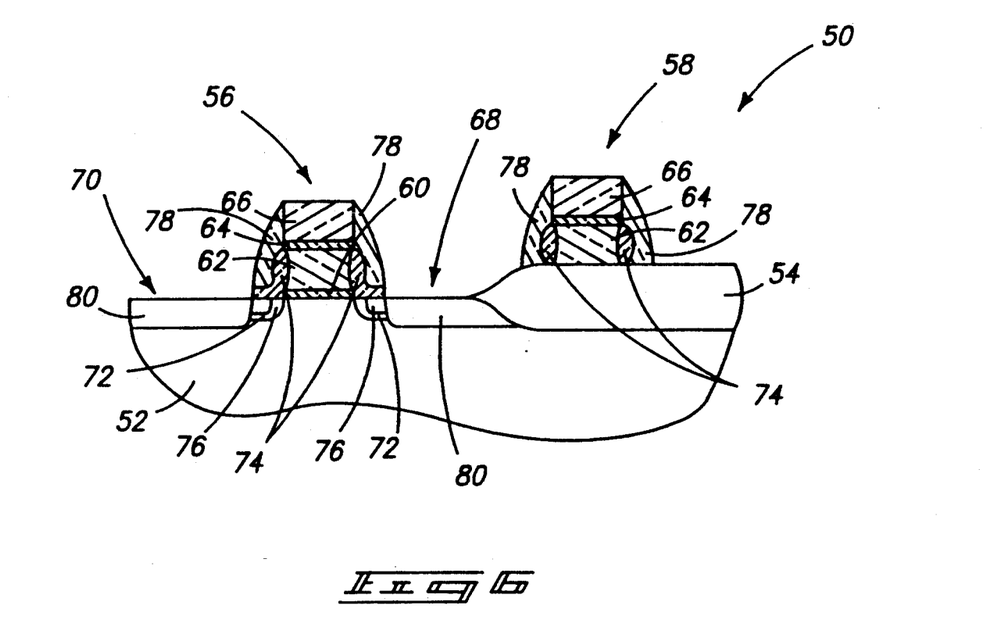
FIG. 6 is a view of the FIG. 4 wafer at a processing step subsequent to that shown by FIG. 5.

Referring to FIG. 6, a layer of insulating material (not explicitly shown) is deposited to a selected thickness over word lines 56, 58 and second LDD implanted first and second regions 68, 70. Such layer is anisotropically etched to define second word line spacers 78. Preferably, the thickness of the layer deposited to produce spacers 78 is provided to from about 2000 Angstroms to about 4000 Angstroms, with about 3000 Angstroms being most preferred. The typical and preferred etch for producing spacers 78 is a dry reactive ion etch. During such etch or thereafter, any remaining insulating material of exposed layer 60 is etched to upwardly expose first and second regions 68, 70, respectively. Thereafter, an n+ implant is conducted into first and second regions 68, 70, respectively, to define n+ active regions 80. Oxidizing the side walls of polysilicon word lines 58, 60 as opposed to depositing a layer of silicon dioxide and subsequently anisotropically etching, saves a mask step. Further, oxidized portions 74 laterally project to the word lines a lesser distance than typical spacers provided by layering and subsequent anisotropic etching.

The above described process through FIG. 6 is but one example of, a) providing an array of electrically insulated word lines atop a semiconductor wafer; b) defining upwardly exposed first active regions adjacent the word lines for connection with memory cell capacitors; and c) defining upwardly exposed second active regions adjacent the word lines for electric connection with bit lines, in accordance with the invention. Such technique is described in our co-pending U.S. patent application Ser. No. 07/870,606 entitled "An Array of Finned Memory Cell Capacitors on a Semiconductor Substrate and a Method of Forming a Capacitor", filed on Apr. 16, 1992, and is hereby incorporated by reference. Other methods could also be utilized, such as by way of example only, conventional spacer creation by layering and subsequent anisotropic etching.

Figure 7:
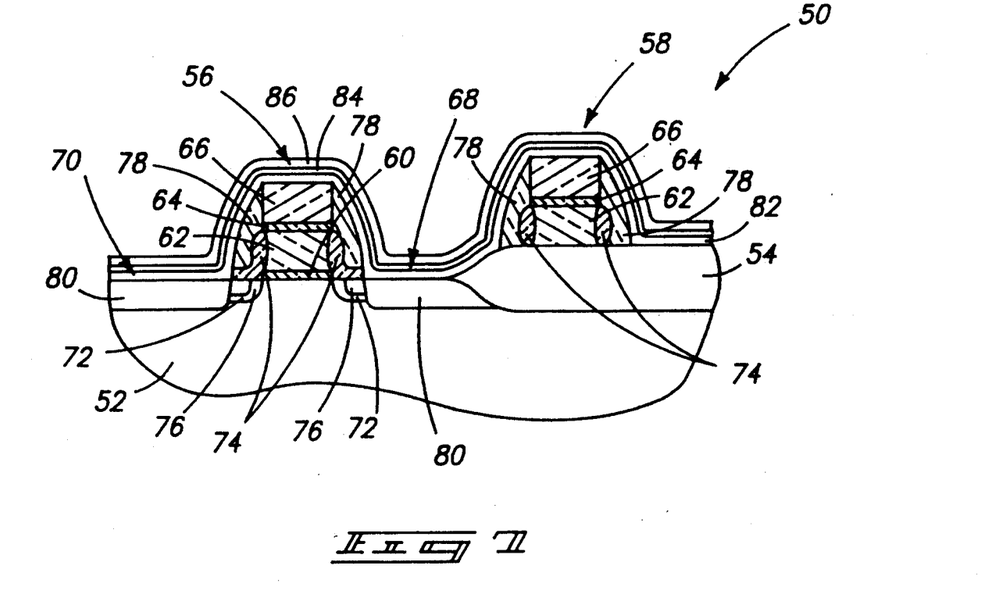
FIG. 7 is a view of the FIG. 4 wafer at a processing step subsequent to that shown by FIG. 6.

Referring to FIG. 7, a layer 82 of polysilicon is deposited atop the wafer to contact and cover upwardly exposed first and second active regions 68, 70, respectively. Poly layer 82 is preferably deposited to a thickness of from about 500 Angstroms to about 1500 Angstroms, with about 1000 Angstroms being most preferred. Layer 82 can be either undoped or conductively doped at this stage in the process, with an undoped polysilicon layer being preferred. Layer 82 will ultimately be utilized, in part, for fabrication of isolated capacitor storage nodes and therefore will ultimately be conductive. It is preferably left undoped at this point in the process to prevent later processing steps from driving dopant atoms into active regions 80. A subsequent sacrificial layer 84 of a thermal oxidation barrier material is deposited atop polysilicon layer 82. Sacrificial thermal oxidation barrier material layer 84 is preferably deposited to a thickness of from about 100 Angstroms to about 200 Angstroms, with about 150 Angstroms being most preferred. The material of layer 84 is selectively etchable relative to the underlying polysilicon of layer 82. A preferred material is a nitride, such as $Si_3N_4$. The function of layer 84 will be more apparent from the continuing discussion.

Figure 8:
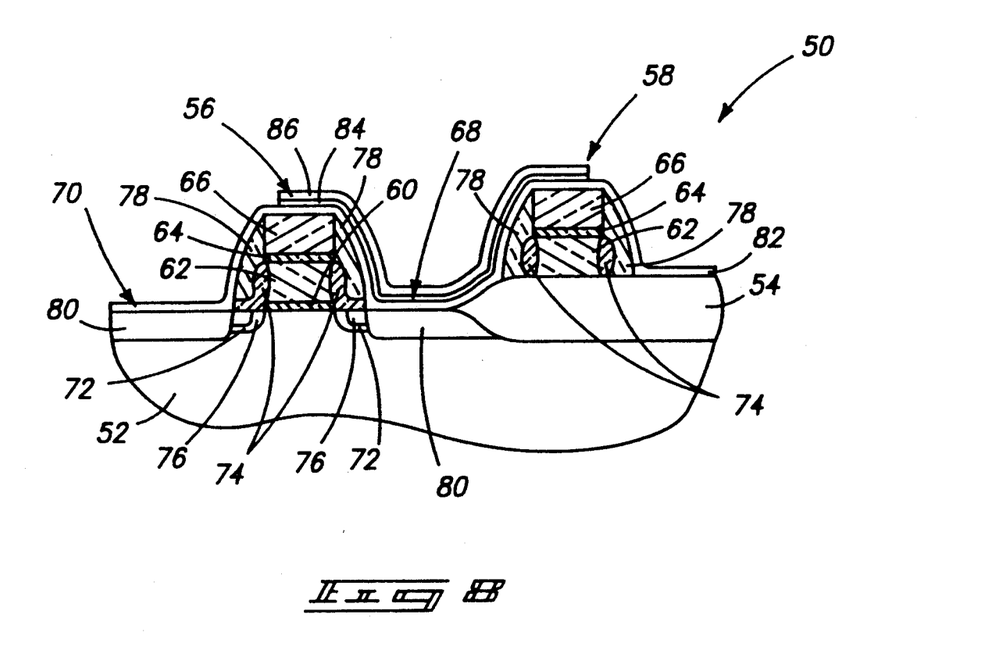
FIG. 8 is a view of the FIG. 4 wafer at a processing step subsequent to that shown by FIG. 7.

A sacrificial layer 86 of a masking material is deposited atop sacrificial oxidation barrier material layer 84. Sacrificial masking layer 86 is preferably deposited to a thickness of from about 100 Angstroms to about 200 Angstroms, with about 150 Angstroms being most preferred. A preferred material for layer 86 is a deposited oxide, such as $SiO_2$. The purpose of such layer will become apparent with the continuing discussion as the process proceeds from that of FIG. 7 to produce that which is shown in FIG. 8. A layer of photoresist (not shown) would be deposited atop the FIG. 7 wafer, and patterned to enable removal of portions of oxide layer 86 and nitride layer 84 to produce the illustrated FIG. 8 construction which will be utilized for definition of isolated capacitor storage nodes. More particularly with such photoresist pattern in place, exposed sacrificial masking layer 86 material would be selectively etched relative to the patterned photoresist. An example wet etching chemistry technique would include wafer dipping in a buffered HF mixture of 10:1 water to HF solution by volume, where the HF solution is 49% HF in water by volume. Thereafter, the patterned photoresist would be stripped from the wafer. Such will leave nitride layer 84 in its original deposited state, with a patterned layer of oxide 86. From here, the exposed areas of nitride layer 84 are selectively etched relative to the underlying polysilicon to define the FIG. 8 illustrated selected pattern of oxidation barrier material atop polysilicon layer 82 over first active regions 68 for formation of capacitor storage nodes.

The purpose of layer 84 is to overcome an inherent difficulty in wet etching nitride selectively relative to photoresist. Were oxide layer 86 not in place, a step would be provided where nitride need be etched selectively relative to patterned photoresist. Such is not possible utilizing the typical $H_3PO_4$ wet acid chemistry utilized in etching nitride. Oxide cap or layer 86, as described above, provides the necessary protection in the described sequence to enable the FIG. 8 construction to be produced utilizing preferred and simplified wet etching techniques. Note that dry etching techniques are known for etching nitride selectively relative to photoresist, which would make the use of oxide mask layer 86 unnecessary. Example dry etch chemistries include $CF_4$ and $SF_6$. Also, materials other than nitride might be utilized for layer 84, in accordance with the above discussion. Were such alternate materials wet etchable relative to photoresist, masking layer 86 would most likely not be utilized.

Figure 9:
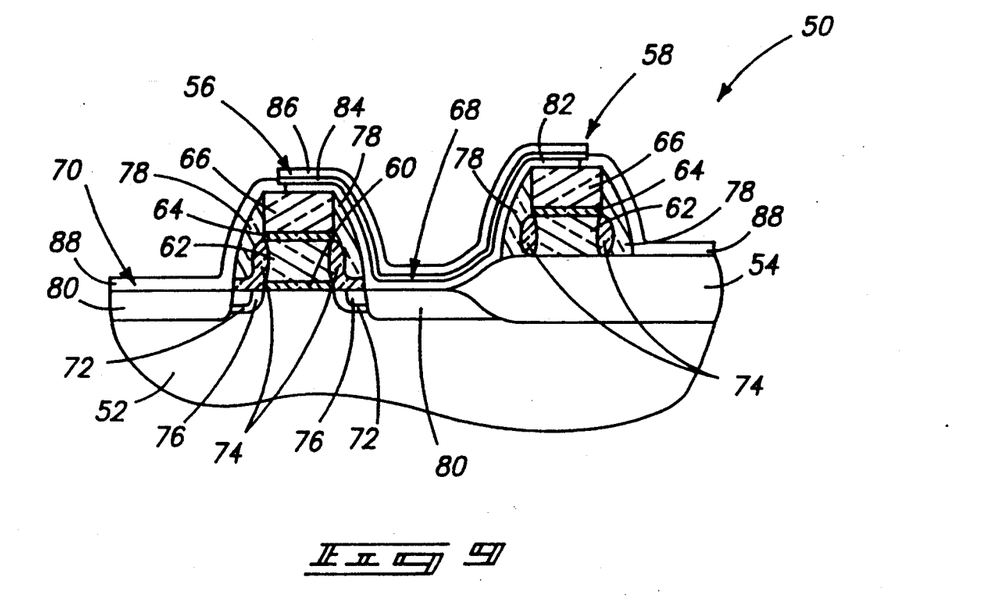
FIG. 9 is a view of the FIG. 4 wafer at a processing step subsequent to that shown by FIG. 8.

Referring to FIG. 9, wafer 50 is next subjected to thermal oxidation conditions to oxidize unmasked areas of polysilicon layer 82, thus producing $SiO_2$ regions 88. Oxidation of exposed areas of polysilicon layer 82 to produce oxidized regions 88 will about double the thickness of original polysilicon layer 82. Example conditions for such a thermal oxidation would include 900° C. in a steam ambient for approximately 15 minutes. The sacrificial masking oxidation barrier material of layer 84 precludes appreciable oxidation of polysilicon thereunder during such oxidation step. Note that some oxidation of layer 82 beneath layer 84 does occur from the outer lateral edges of the masked portion of layer 84.

Figure 10:
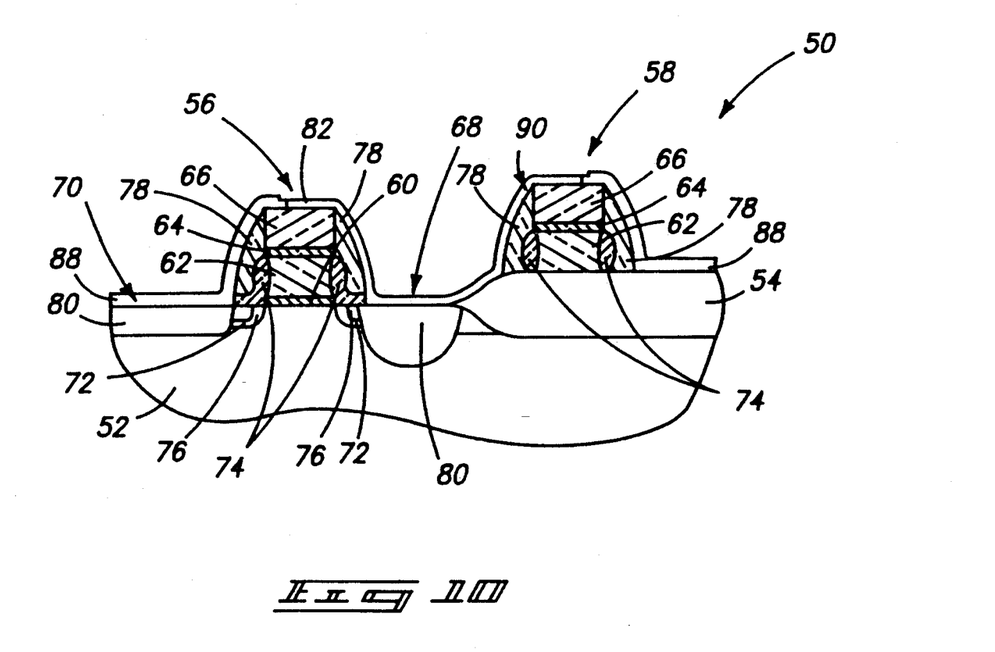
FIG. 10 is a view of the FIG. 4 wafer at a processing step subsequent to that shown by FIG. 9.

Referring to FIG. 10 and after subjecting the wafer to the thermal oxidation conditions, remaining masking layer 86 material and sacrificial oxidation barrier layer 84 material are etched from the wafer to upwardly expose unoxidized remaining polysilicon from original polysilicon layer 82. Such exposed unoxidized polysilicon will comprise an isolated capacitor storage node 90. Example wet etching chemistry for removing the oxide would typically include an HF solution. Note that such an etch will also remove thermally grown or produced oxide material of layer 88. However, the above etch conditions for the deposited oxide of layer 86 are fairly selective to the thermally grown oxide of layer 88. Accordingly, a significantly smaller quantity of material of layer 88 is removed as compared to the entirety of remaining layer 86. An example wet etch chemistry for then removing the nitride of layer 84 would include an $H_3PO_4$ solution.

At this point in the process and where polysilicon layer 82 as initially deposited was undoped, layer 28 would be conductively doped. An example dopant concentration would be $5 \times 10^{19}$ atoms/cm3. Poly layer 82 was preferably originally undoped to prevent dopant diffusion into bitline or storage node contacts during the above described oxidation step. Such heating for oxidation would have driven the dopants into active areas 80 affecting their desired concentration and adversely driving such active areas deeper into bulk substrate 52.

Note that where a masking layer 86 is utilized, such might also comprise polysilicon. Under such circumstances, the thickness of such a layer 86 would be significantly less than the thickness of polysilicon layer 82. For example, where polysilicon layer 82 is most preferably about 1000 Angstroms, the thickness of a polysilicon layer 86 would be about 200 Angstroms. Were such technique utilized, the thermal oxidation conditions would also oxidize the polysilicon of sacrificial layer 86. For removing the same from the wafer for ultimate removal of the remaining etched portion of nitride layer 84, such an etch would comprise conducting a time controlled etch sufficient to completely remove the formed silicon oxide over remaining etched nitride 84, but yet insufficient to etch the unmasked areas of oxidized polyisilicon regions 88 to the point of active region 70 exposure.

Figure 11:
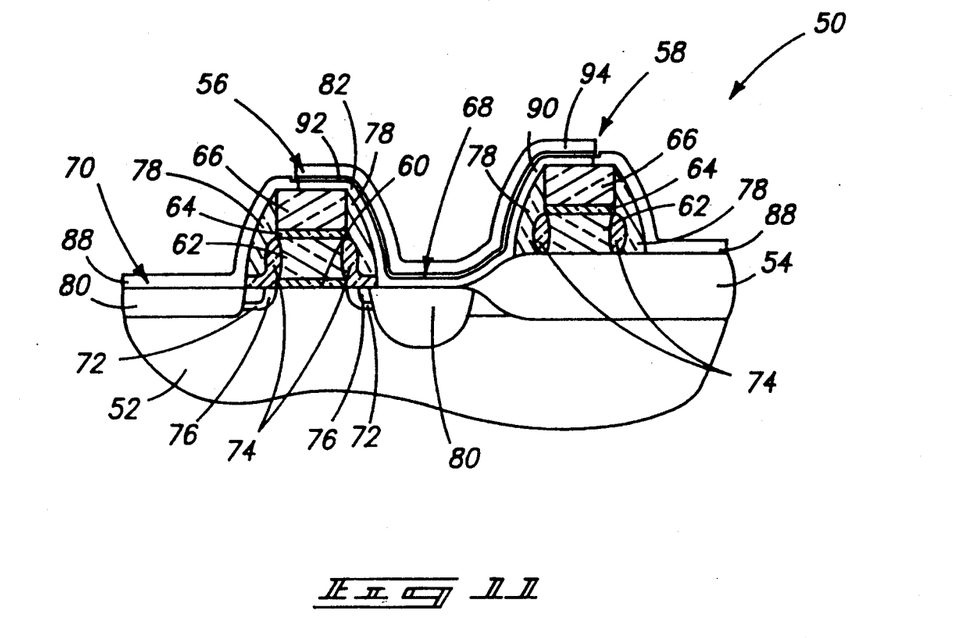
FIG. 11 is a view of the FIG. 4 wafer at a processing step subsequent to that shown by FIG. 10.

Referring to FIG. 11, a layer 92 of capacitor dielectric is provided atop isolated capacitor storage nodes 90, followed by the provision of a subsequent layer 94 of cell polysilicon atop capacitor dielectric layer 92. Such could be patterned to produce the finished illustrated capacitor construction.

Note that the above described process has eliminated the buried contact mask and the photoresist misalignment problems surrounded therewith. In eliminating the photolithography misalignment concerns, the density of the memory cells can be increased. Such a process is also considered to be "self aligned" in producing the buried contacts.

Figure 12:
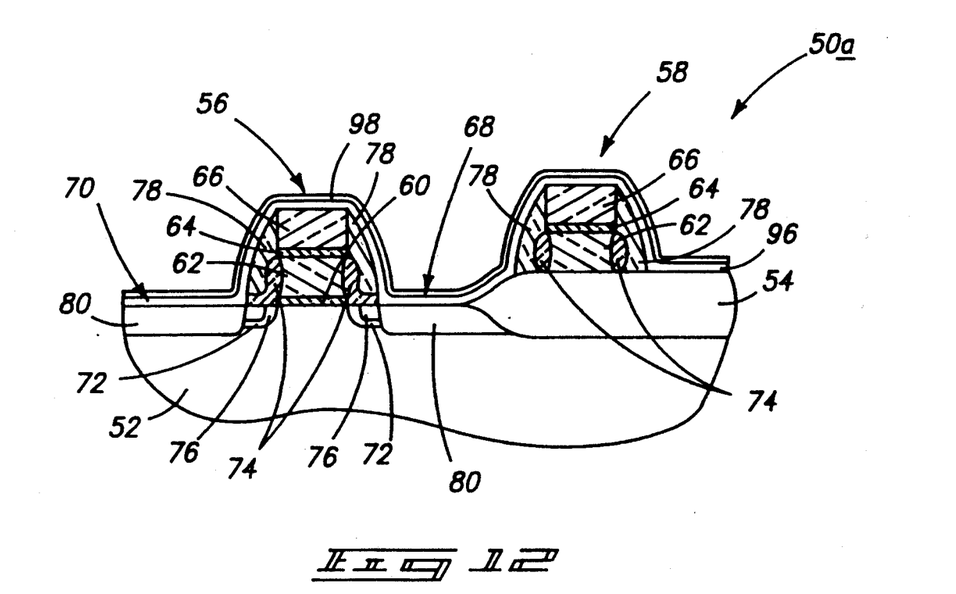
FIG. 12 is a diagrammatic sectional view of a semiconductor wafer fragment at one alternate processing step in accordance with the invention.

An alternate method in accordance with the invention is described with reference to FIGS. 12-15. FIG. 12 depicts an alternate process step which would be conducted after producing the construction of FIG. 6 of the first embodiment. Referring specifically to FIG. 12, a sacrificial layer 96 of a thermal oxidation barrier material is deposited atop the wafer to cover upwardly exposed first and second active regions 68, 70, respectively. Such layer should have the same properties as layer 84 in the first described embodiment, namely to provide a barrier to oxidation of underlying silicon material. The thickness of layer 96 is preferably from about 100 Angstroms to about 200 Angstroms, with about 150 Angstroms being most preferred. Layer 96 is again preferably a nitride material, for example Si₃N₄. A sacrificial layer 98 of a masking material is deposited atop oxidation barrier material layer 96. The thickness of layer 98 is preferably from about 100 Angstroms to about 300 Angstroms, with about 200 Angstroms being most preferred. Its desirability and purpose is as described with reference to the above embodiment namely to facilitate a selective wet phosphoric etch in the presence of photoresist as opposed to requiring a dry etching processes.

Figure 13:
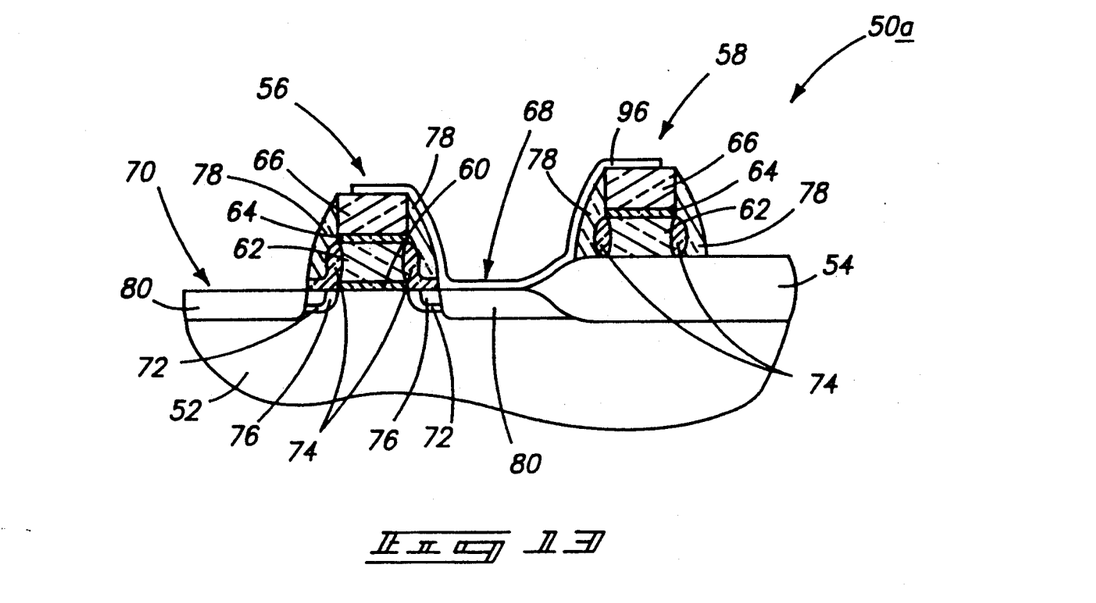
FIG. 13 is a view of the FIG. 12 wafer at a processing step subsequent to that shown by FIG. 12.

Referring to FIGS. 12 and 13, a layer of photoresist (not shown) is deposited over sacrificial layer 96 and developed to provide a desired photoresist pattern for use in ultimate formation of an isolated capacitor storage node. Exposed sacrificial masking material of layer 98 would then be selectively etched relative to the patterned photoresist. An example wet etching chemistry technique would include wafer dipping in a buffered HF mixture of 10:1 water to HF solution by volume, where the HF solution is 49% HF in water by volume. The patterned photoresist would then be stripped from the wafer, leaving oxide where the striped photoresist was, and exposed nitride elsewhere on the wafer. Such exposed nitride would be wet etched selectively relative to underlying material. Example wet etching chemistry for removing the oxide would typically include an H₃PO₄ solution. Thereafter, remaining oxide of layer 98 over region 68 would be etched selectively relative to nitride and other underlying material to define a covering pattern of masking oxidation barrier material over first active region 68, and to upwardly expose second active regions 70, leaving the construction of FIG. 13. Example wet etching chemistry for removing the oxide would typically include an HF solution.

Figure 14:
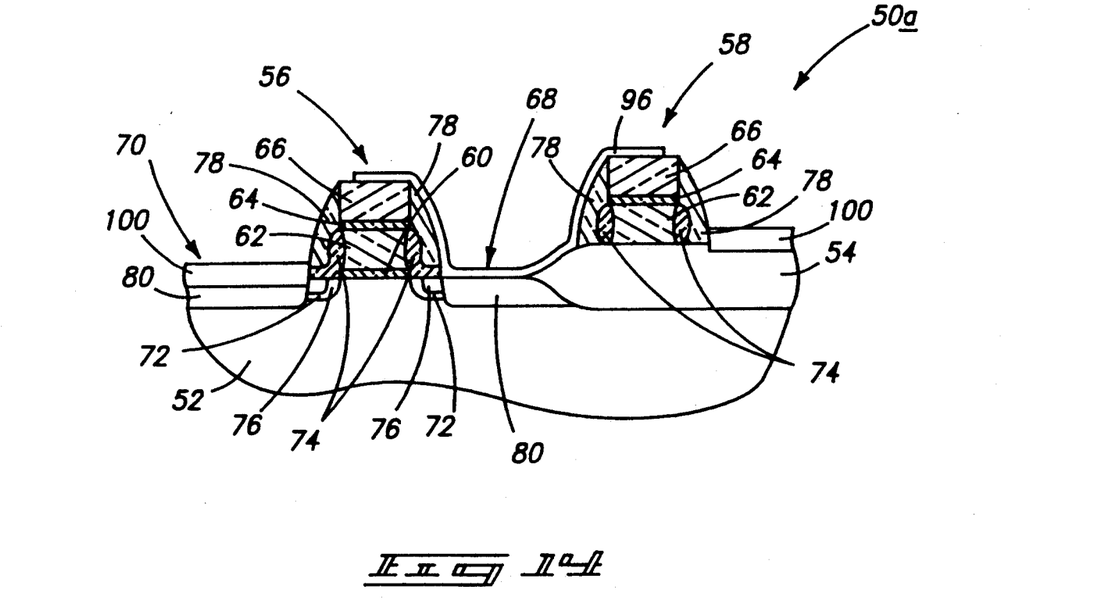
FIG. 14 is a view of the FIG. 12 wafer at a processing step subsequent to that shown by FIG. 13.

Referring to FIG. 14, wafer 50a is subjected to thermal oxidation conditions to oxidize unmasked second active area 70 and other silicon areas on the wafer, thus providing oxidized regions 100. Such results from consumption of silicon of substrate 52. Example conditions for such a thermal oxidation would include 900° C. in a steam ambient for approximately 15 minutes. During such oxidation, patterned nitride material layer 96 precludes any appreciable oxidation of first active region 68 thereunder. Such a procedure at this point in the process has the effect of being "self-aligned" by insulating all exposed silicon areas on the wafer. After subjecting wafer 58 of the thermal oxidizing conditions, the remaining oxidation barrier material is selectively etched or striped from the wafer to now upwardly expose first active region 70. As in the first described embodiment, where dry etching techniques or an alternate oxidation barrier material other than nitride is utilized, utilization of sacrificial masking layer 98 might be avoided thereby minimizing process steps.

Figure 15:
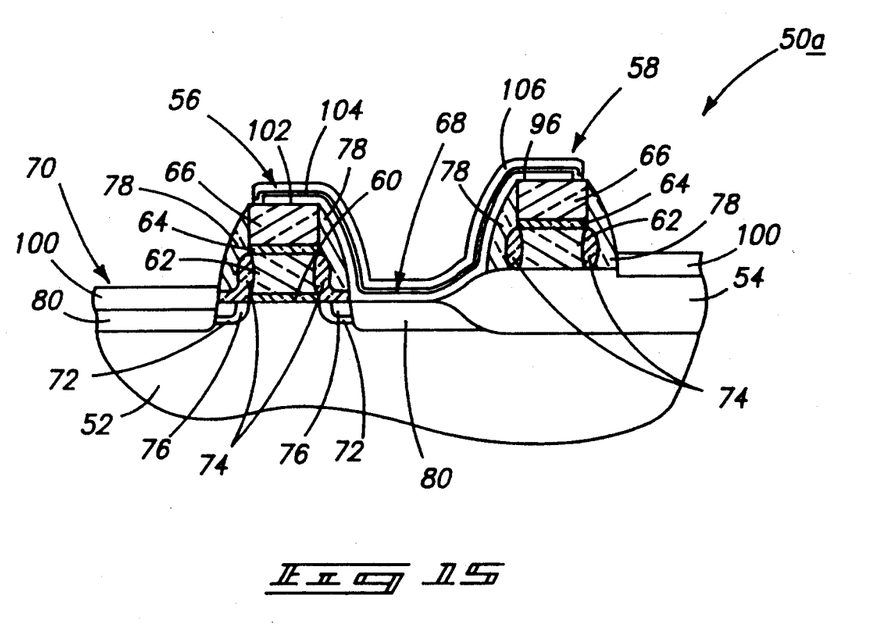
FIG. 15 is a view of the FIG. 12 wafer at a processing step subsequent to that shown by FIG. 14.

Referring to FIG. 15, a layer 102 of a capacitor storage node polysilicon is provided atop the wafer, followed by subsequent provisions of a capacitor dielectric layer 104 and a cell polysilicon layer 106. Such are patterned as shown.

In compliance with the statute, the invention has been described in language more or less specific as to methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents. ·

I claim:

1. A method of forming memory cell capacitors without using a buried capacitor contact mask comprising the following steps:
   providing an array of electrically insulated word lines atop a semiconductor wafer;
   defining upwardly exposed first active regions adjacent the word lines for connection with memory cell capacitors;
   defining upwardly exposed second active regions adjacent the word lines for electrical connection with bit lines;
   depositing a layer of polysilicon atop the wafer to cover the upwardly exposed first and second active regions;
   depositing a sacrificial layer of a thermal oxidation barrier material atop the polysilicon layer, the oxidation barrier material being selectively etchable relative to the underlying polysilicon;
   etching the sacrificial oxidation barrier material selectively relative to the underlying polysilicon to define a selected pattern of masking oxidation barrier material atop polysilicon over the first active regions for formation of capacitor storage nodes;

subjecting the wafer to thermal oxidation conditions to oxidize unmasked areas of the polysilicon layer, the patterned sacrificial masking oxidation barrier material precluding appreciable oxidation of polysilicon thereunder during such oxidation;

after subjecting the wafer to the thermal oxidation conditions, etching remaining sacrificial oxidation barrier material from the wafer to upwardly expose unoxidized polysilicon, such exposed unoxidized polysilicon comprising isolated capacitor storage nodes;

providing a layer of capacitor dielectric atop the isolated capacitor storage nodes; and providing a layer of cell polysilicon atop the capacitor dielectric layer.

2. The method of forming memory cell capacitors of claim 1 wherein the layer of deposited polysilicon is undoped, the method further comprising:

conductively doping the upwardly exposed unoxidized polysilicon.

3. The method of forming memory cell capacitors of claim 1 wherein the oxidation barrier material comprises a nitride.

4. The method of forming memory cell capacitors of claim 1 wherein the oxidation barrier material comprises $Si_3N_4$.

5. The method of forming memory cell capacitors of claim 1 wherein the oxidation barrier material comprises a nitride, the layer of deposited polysilicon is undoped, and the method further comprises: conductively doping the upwardly exposed unoxidized polysilicon.

6. A method of forming memory cell capacitors without using a buried capacitor contact mask comprising the following steps:

providing an array of electrically insulated word lines atop a semiconductor wafer;

defining upwardly exposed first active regions adjacent the word lines for connection with memory cell capacitors;

defining upwardly exposed second active regions adjacent the word lines for electrical connection with bit lines;

depositing a layer of polysilicon atop the wafer to cover the upwardly exposed first and second active regions;

depositing a sacrificial layer of a nitride material atop the polysilicon layer;

providing a photoresist pattern over the deposited sacrificial layer of masking material for definition of capacitor storage nodes;

etching exposed sacrificial masking layer material selectively relative to the patterned photoresist;

stripping the patterned photoresist from the wafer;

etching exposed nitride selectively relative to the sacrificial masking layer material to define a selected pattern of masking material and nitride atop polysilicon over the first active regions for formation of capacitor storage nodes;

subjecting the wafer to thermal oxidation conditions to oxidize unmasked areas of the polysilicon layer, the nitride precluding appreciable oxidation of polysilicon thereunder during such oxidation;

after subjecting the wafer to the thermal oxidation conditions, etching remaining masking layer material from the wafer;

after etching remaining masking layer material from the wafer, etching remaining nitride material from the wafer to upwardly expose unoxidized polysilicon, such exposed unoxidized polysilicon comprising isolated capacitor storage nodes;

providing a layer of capacitor dielectric atop the isolated capacitor storage nodes; and providing a layer of cell polysilicon atop the capacitor dielectric layer.

7. The method of forming memory cell capacitors of claim 6 wherein the nitride material comprises $Si_3N_4$.

8. The method of forming memory cell capacitors of claim 6 wherein the sacrificial layer of masking material comprises a deposited oxide.

9. The method of forming memory cell capacitors of claim 6 wherein the nitride material comprises $Si_3N_4$, and the sacrificial layer of masking material comprises a deposited oxide.

10. The method of forming memory cell capacitors of claim 6 wherein, the polysilicon layer and sacrificial layer of masking material are deposited to respective selected thicknesses, the thickness of the sacrificial layer of masking material being less than the thickness of the polysilicon;

the sacrificial layer of masking material comprises polysilicon;

the step of thermal oxidation comprises oxidizing the polysilicon of the sacrificial masking layer to form a silicon oxide; and the step of etching remaining masking layer material from the wafer comprises conducting a time controlled etch sufficient to completely remove silicon oxide over the nitride but insufficient to etch the unmasked areas of oxidized polysilicon to the point of active region exposure.

11. The method of forming memory cell capacitors of claim 6 wherein the layer of deposited polysilicon is undoped, the method further comprising:

conductively doping the upwardly exposed unoxidized polysilicon.

12. The method of forming memory cell capacitors of claim 6 wherein the sacrificial layer of masking material comprises a deposited oxide, the layer of deposited polysilicon is undoped, and the method further comprises conductively doping the upwardly exposed unoxidized polysilicon.

13. The method of forming memory cell capacitors of claim 6 wherein, the polysilicon layer and sacrificial layer of masking material are deposited to respective selected thicknesses, the thickness of the sacrificial layer of masking material being less than the thickness of the polysilicon;

the layer of deposited polysilicon is undoped;

the sacrificial layer of masking material comprises polysilicon;

the step of thermal oxidation comprises oxidizing the polysilicon of the sacrificial masking layer to form a silicon oxide;

the step of etching remaining masking layer material from the wafer comprises conducting a time controlled etch sufficient to completely remove silicon oxide over the nitride but insufficient to etch the unmasked areas of oxidized polysilicon to the point of active region exposure; and the method further comprises conductively doping the upwardly exposed unoxidized polysilicon.

14. A method of forming memory cell capacitors without using a buried capacitor contact mask comprising the following steps:
- providing an array of electrically insulated word lines atop a semiconductor wafer;
- defining upwardly exposed first active regions adjacent the word lines for connection with memory cell capacitors;
- defining upwardly exposed second active regions adjacent the word lines for electrical connection with bit lines;
- depositing a sacrificial layer of a thermal oxidation barrier material atop the wafer to cover the upwardly exposed first and second active regions;
- etching said sacrificial layer of a thermal oxidation barrier material selectively relative to underlying material to define a covering pattern of masking oxidation barrier material over the first active regions and to upwardly expose second active regions;
- subjecting the wafer to thermal oxidation conditions to oxidize unmasked second active areas, the patterned sacrificial masking oxidation barrier material layer precluding appreciable oxidation of first active regions thereunder during such oxidation;
- after subjecting the wafer to the thermal oxidation conditions, selectively etching remaining sacrificial oxidation barrier material from the wafer to upwardly expose first active regions;
- providing a layer of capacitor storage node polysilicon atop the wafer;
- providing a layer of capacitor dielectric atop the capacitor storage node layer; and
- providing a layer of cell polysilicon atop the capacitor dielectric layer.

15. The method of forming memory cell capacitors of claim 14 wherein the oxidation barrier material comprises a nitride.

16. The method of forming memory cell capacitors of claim 6 wherein the oxidation barrier material comprises $Si_3N_4$.

17. A method of forming memory cell capacitors without using a buried capacitor contact mask comprising the following steps:
- providing an array of electrically insulated word lines atop a semiconductor wafer;
- defining upwardly exposed first active regions adjacent the word lines for connection with memory cell capacitors;
- defining upwardly exposed second active regions adjacent the word lines for electrical connection with bit lines;
- depositing a sacrificial layer of a nitride material atop the wafer to cover the upwardly exposed first and second active regions;
- depositing a sacrificial layer of a masking material atop the nitride;
- providing a photoresist pattern over the deposited sacrificial layer of masking material;
- etching exposed sacrificial masking layer material selectively relative to the patterned photoresist;
- stripping patterned photoresist from the wafer;
- etching exposed nitride material selectively relative to underlying material to define a covering pattern of masking nitride over the first active regions and to upwardly expose second active regions;
- subjecting the wafer to thermal oxidation conditions to oxidize unmasked second active areas, the patterned nitride material layer precluding appreciable oxidation of first active regions thereunder during such oxidation;
- after subjecting the wafer to the thermal oxidation conditions, selectively etching remaining nitride material from the wafer to upwardly expose first active regions;
- providing a layer of capacitor storage node polysilicon atop the wafer;
- providing a layer of capacitor dielectric atop the capacitor storage node layer; and
- providing a layer of cell polysilicon atop the capacitor dielectric layer.

18. The method of forming memory cell capacitors of claim 14 wherein the sacrificial layer of masking material comprises an oxide.

19. The method of forming memory cell capacitors of claim 14 wherein the nitride material comprises $Si_3N_4$.

* * * * *